United States Patent
Sun et al.

(10) Patent No.: US 7,563,688 B2
(45) Date of Patent: Jul. 21, 2009

(54) METHOD FOR FABRICATING CAPACITOR IN SEMICONDUCTOR DEVICE

(75) Inventors: Jun-Hyeub Sun, Ichon-shi (KR); Sang-Oh Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 384 days.

(21) Appl. No.: 11/617,675

(22) Filed: Dec. 28, 2006

(65) Prior Publication Data

US 2007/0202657 A1  Aug. 30, 2007

(30) Foreign Application Priority Data

Feb. 24, 2006 (KR) ............... 10-2006-0018141
Dec. 8, 2006 (KR) ............... 10-2006-0124737

(51) Int. Cl.
*H01L 21/00* (2006.01)
(52) U.S. Cl. .............. 438/396; 438/685; 438/738
(58) Field of Classification Search .......... 438/396, 438/385, 738
See application file for complete search history.

(56) References Cited

U.S. PATENT DOCUMENTS

| | | | | |
|---|---|---|---|---|
| 7,115,993 B2 * | 10/2006 | Wetzel et al. | ............... | 257/758 |
| 7,226,853 B2 * | 6/2007 | Bekiaris et al. | ............. | 438/622 |
| 7,332,395 B2 * | 2/2008 | Yokoi | .......................... | 438/253 |
| 2003/0119307 A1 * | 6/2003 | Bekiaris et al. | ............. | 438/638 |
| 2006/0008741 A1 * | 1/2006 | Yin et al. | ..................... | 430/311 |
| 2006/0022247 A1 * | 2/2006 | Yin et al. | ..................... | 257/296 |
| 2006/0024945 A1 * | 2/2006 | Kim et al. | .................... | 438/618 |
| 2006/0099768 A1 * | 5/2006 | Yokoi | .......................... | 438/381 |
| 2006/0115946 A1 * | 6/2006 | Kim et al. | .................... | 438/244 |
| 2007/0155114 A1 * | 7/2007 | Ban et al. | .................... | 438/396 |
| 2007/0202657 A1 * | 8/2007 | Sun et al. | .................... | 438/396 |
| 2007/0243714 A1 * | 10/2007 | Shin et al. | ................... | 438/706 |
| 2008/0009119 A1 * | 1/2008 | Eto | ............................. | 438/386 |
| 2008/0020583 A1 * | 1/2008 | Ueda et al. | ................... | 438/717 |
| 2008/0124887 A1 * | 5/2008 | Tanaka | ...................... | 438/386 |
| 2008/0157174 A1 * | 7/2008 | Jeon | ........................... | 257/321 |
| 2008/0192407 A1 * | 8/2008 | Lu et al. | ..................... | 361/502 |
| 2008/0305608 A1 * | 12/2008 | Cho | ........................... | 438/397 |

FOREIGN PATENT DOCUMENTS

| | | |
|---|---|---|
| KR | 2001-8672 | 2/2001 |
| KR | 1020010037206 A | 5/2001 |
| KR | 1020030057600 A | 7/2003 |
| KR | 1020040059780 A | 7/2004 |

OTHER PUBLICATIONS

Korean Intellectual Property Office, Notice of Preliminary Rejection, Application No. 10-2006-0124737, Dec. 10, 2007.
Korean Intellectual Property Office; Notice of Preliminary Rejection; Application No. 10-2006-0124727.

* cited by examiner

*Primary Examiner*—Laura M Menz
(74) *Attorney, Agent, or Firm*—Townsend and Townsend and Crew LLP

(57) ABSTRACT

A method for fabricating a capacitor in a semiconductor device includes forming a stack structure providing a plurality of open regions, the stack structure including an insulation layer and a hard mask pattern, forming a conductive layer over the stack structure and in the open regions, etching a portion of the conductive layer formed outside the open regions to form bottom electrodes in the open regions, removing the hard mask pattern, and etching upper portions of the bottom electrodes that are exposed after the hard mask pattern is removed.

19 Claims, 7 Drawing Sheets

METHOD FOR FABRICATING CAPACITOR IN SEMICONDUCTOR DEVICE

BACKGROUND

The present invention relates to a method for fabricating a semiconductor device, and more particularly, to a method for fabricating a capacitor in a semiconductor device.

As semiconductor devices have become highly integrated and the minimum line width has decreased, the surface area on which a capacitor is formed has also decreased. However, a capacitor in a cell still has to maintain the minimum required capacitance per cell even as the surface area has decreased. Various methods have been developed to form such a capacitor having a small surface and a high capacitance. The methods include using a high-k material such as tantalum oxide ($Ta_2O_5$), aluminum oxide ($Al_2O_3$), or hafnium oxide ($HfO_2$) instead of using silicon oxide layer ($\in$=3.8) and nitride layer ($\in$=7). The methods also include forming a three-dimensional bottom electrode (e.g., cylinder type or concave type) to effectively increase the surface of the bottom electrode, and increasing the effective surface area of a bottom electrode by 1.7 to 2 times through growing meta stable-polysilicon on the effective surface area of the bottom electrode. A bottom electrode isolation process is generally required when fabricating the aforementioned cylinder type or concave type capacitor. Generally, an etch-back process is used.

FIG. 1 illustrates a cross-sectional view of a semiconductor device after a typical bottom electrode isolation process is performed using an etch-back process. Patterned inter-layer insulation layers 12 are formed over a substrate 11. Storage node contact plugs 13 are formed in the patterned inter-layer insulation layers 12 to contact predetermined sections of the substrate 11.

Patterned etch stop layers 14 and patterned sacrificial insulation layers 15, including open regions 16, are sequentially formed over the storage node contact plugs 13 and the patterned inter-layer insulation layers 12. Bottom electrodes 17 are formed in the open regions 16. The bottom electrodes 17 are formed by an isolation process using an etch-back process. The bottom electrodes 17 contain titanium mononitride (TiN). However, upper portions of the bottom electrodes 17 may develop a sharp spire when the etch-back process is used as the bottom electrode isolation process (refer to reference letter 'A'). These sharp spires maintain their shape through a full dip-out process for forming a subsequent cylinder type capacitor. The sharp profile of the bottom electrodes functions as a leakage source for the capacitor when a subsequent dielectric layer and upper electrodes are formed, decreasing the leakage characteristic of the capacitor.

FIG. 2 is a micrograph view illustrating the limitations caused by the typical method. The micrograph shows a profile of a bottom electrode after a bottom electrode isolation process is performed. Upper portions of the bottom electrode remain in a sharp spacer form as denoted with the reference letter 'B'. The sharp form is generated when exposed portions of the bottom electrode are etched at a faster rate than portions of the bottom electrode contacting a sacrificial insulation layer during an etch-back process.

SUMMARY OF THE INVENTION

The present invention provides a method for fabricating a capacitor in a semiconductor device, which can remove the leakage source that is generated as the upper portion of a bottom electrode become sharpened.

In accordance with an embodiment of the present invention, there is provided a method for fabricating a capacitor in a semiconductor device, including: forming a stack structure providing a plurality of open regions, the stack structure including an insulation layer and a hard mask pattern; forming a conductive layer over the stack structure and in the open regions; etching a portion of the conductive layer formed outside the open regions to form bottom electrodes in the open regions; removing the hard mask pattern; and etching upper portions of the bottom electrodes that are exposed after the hard mask pattern is removed.

DETAILED DESCRIPTION OF THE INVENTION

Figure 1:
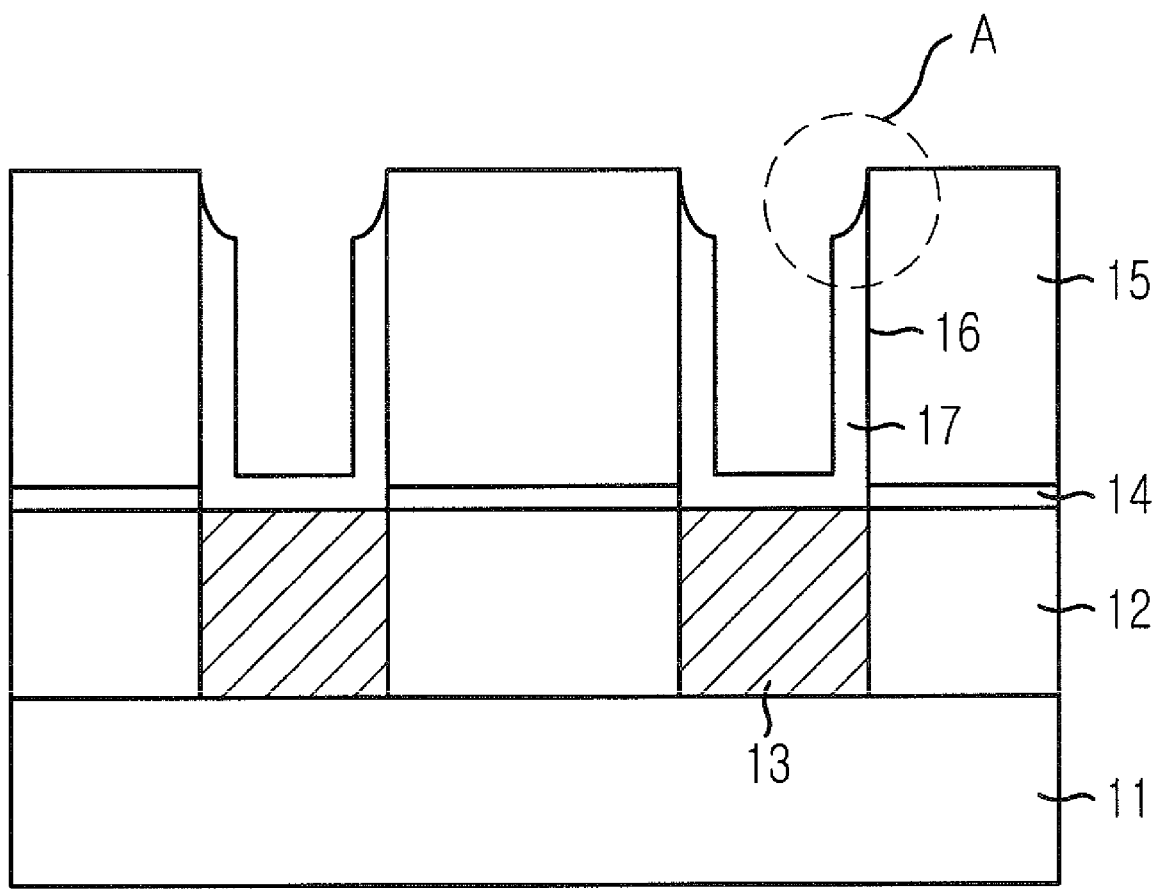
FIG. 1 illustrates a cross-sectional view of a semiconductor device after a typical bottom electrode isolation process using an etch-back process is performed.
Figure 2:
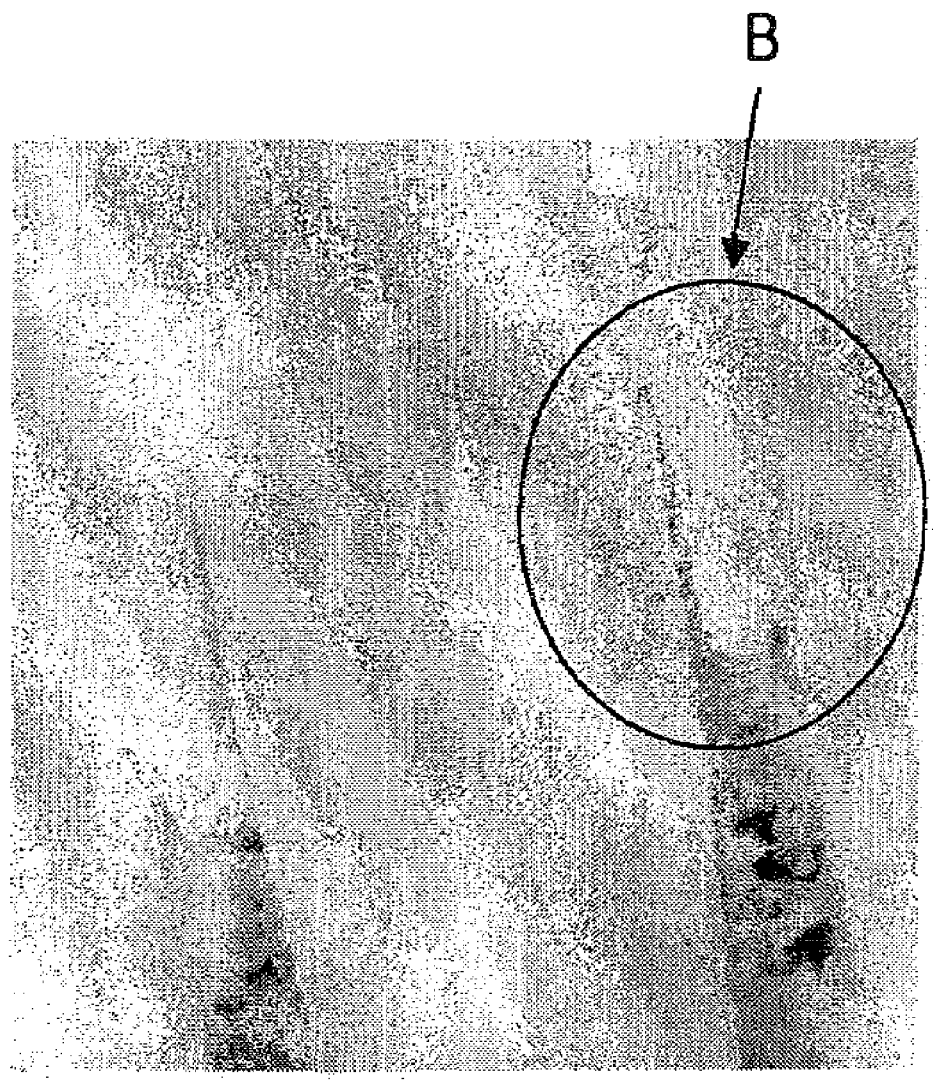
FIG. 2 illustrates a micrographic view of limitations caused by the typical method.

A method for fabricating a capacitor in a semiconductor device in accordance with embodiments of the present invention will be described in detail with reference to the accompanying drawings. The same reference numerals through out the embodiments of the present invention represent same or like elements in different drawings.

Figure 3A:
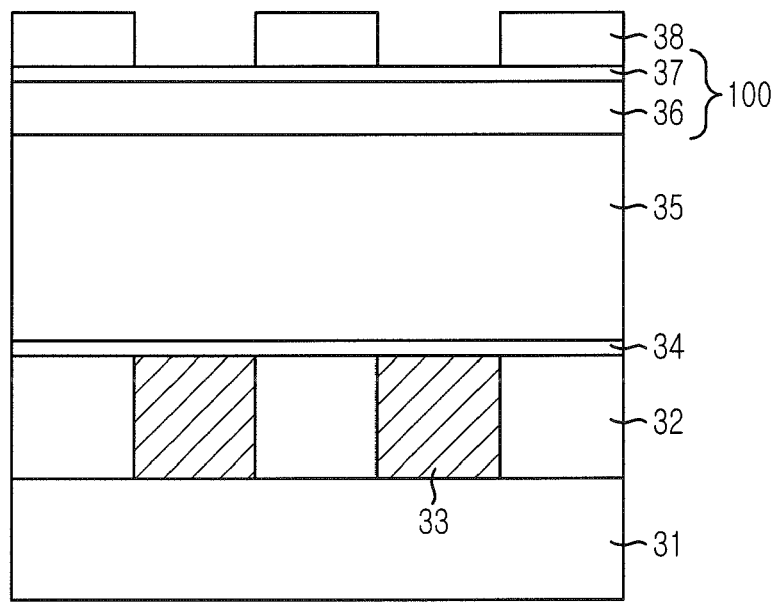
FIGS. 3A to 3I illustrate cross-sectional views to describe a method for fabricating a capacitor in a semiconductor device consistent with an embodiment of the present invention.

Referring to FIG. 3A, patterned inter-layer insulation layers 32 are formed over a substrate 31. In more detail, an inter-layer insulation layer is formed over the substrate 31. Although not illustrated, a transistor including gate electrodes and source/drain are formed, and an inter-layer insulation process for covering the transistors and a bit line process are performed prior to the formation of the inter-layer insulation layer. Thus, the inter-layer insulation layer is configured in a multiple-layer structure.

Portions of the inter-layer insulation layer are etched to form storage node contact holes (not shown) and the patterned inter-layer insulation layers 32. Storage node contact plugs 33 are filled into the storage node contact holes. The storage node contact plugs 33 allow signal processes between the capacitor and the transistor. The storage node contact plugs 33 may be formed by forming a polysilicon layer and performing an etch-back process.

An etch stop layer 34 and a sacrificial insulation layer 35 are sequentially formed over the patterned inter-layer insulation layers 32 and the storage node contact plugs 33. The etch stop layer 34 functions as an etch barrier for the storage node contact plugs 33 and the patterned inter-layer insulation layers 32 during a subsequent dry etching process of the sacrificial insulation layer 35. The etch stop layer 34 may include a nitride-based layer, such as a silicon nitride ($Si_3N_4$) layer. The sacrificial insulation layer 35 is formed to provide three-dimensional open regions for forming the bottom electrodes. The sacrificial insulation layer 35 may include an oxide-based material, such as phosphosilicate glass (PSG), tetraethyl orthosilicate (TEOS), borophosphosilicate glass (BPSG), or undoped silicate glass (USG).

A hard mask 100 is formed over the sacrificial insulation layer 35. The hard mask 100 is formed to improve the selectivity of the photoresist during an etching process for forming open regions with a large aspect ratio. The hard mask 100 is configured in a double-layer structure (i.e., a double hard mask), including an amorphous carbon layer 36 and a silicon oxynitride layer 37. The amorphous carbon layer 36 may have a thickness ranging from approximately 3,000 Å to approximately 10,000 Å. The silicon oxynitride layer 37 may have a thickness ranging from approximately 300 Å to approximately 1,000 Å. The armophous carbon layer 36 has a higher selectivity than an oxide-based layer, a nitride-based layer, and a silicon-based layer during the etching process for forming the subsequent open regions. The silicon oxynitride layer 37 functions as an etch barrier during the etching process for forming the subsequent open regions. At the same time, the silicon oxynitride layer 37 functions as an anti-reflective coating layer for reducing diffused reflection during a photolithography process.

A photoresist layer is formed over the hard mask 100. The photoresist layer is patterned by performing photo-exposure and developing processes to form a photoresist pattern 38. The photoresist pattern 38 includes an ArF photoresist material using ArF as the source of exposure.

Figure 3B:
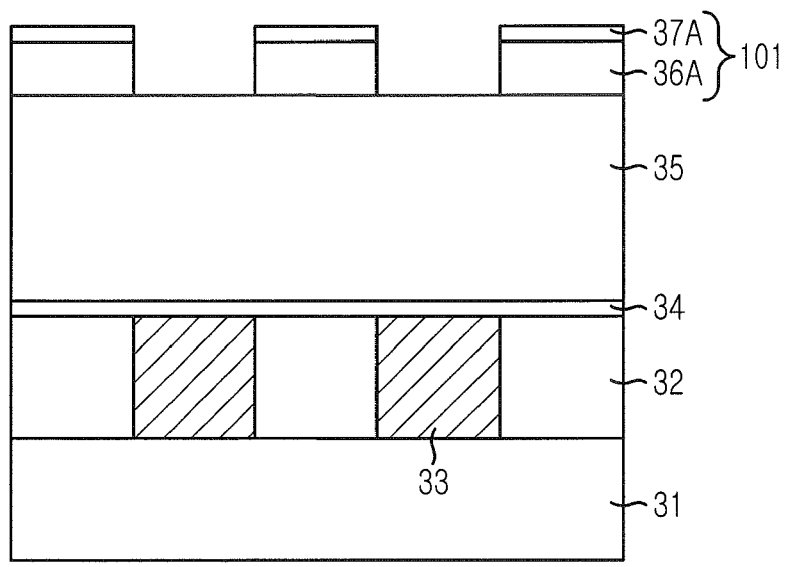

Referring to FIG. 3B, the hard mask 100 is etched to form a hard mask pattern 101 using the photoresist pattern 38 as an etch barrier. The hard mask pattern 101 is configured in a double layer structure including patterned amorphous carbon layers 36A and patterned silicon oxynitride layers 37A. Meanwhile, the photoresist pattern 38 may be etched away during the etching of the hard mask 100. The silicon oxynitride layer 37 is etched using a fluorine-based plasma, such as tetrafluoromethane ($CF_4$), to form the patterned silicon oxynitride layers 37A. The amorphous carbon layer 36 is etched using a plasma of a gas mixture including oxygen ($O_2$) and nitrogen ($N_2$) to form the patterned amorphous carbon layers 36A during the etching process of the hard mask 100.

Figure 3C:
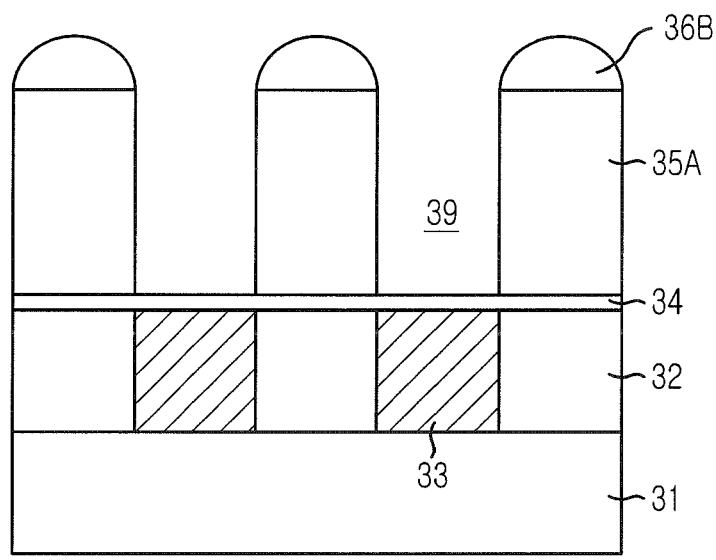

Referring to FIG. 3C, the sacrificial insulation layer 35 is etched until the etching stops at the etch stop layer 34, using the hard mask pattern 101 including the pattern silicon oxynitride layers 37A and the pattern amorphous carbon layers 36A as an etch barrier. Thus, a plurality of open regions 39 and patterned sacrificial insulation layers 35A are formed.

A gas having a high carbon content, such as $C_4F_6$ or $C_4F_8$, is used as a main etch gas and an additive gas is added to the main etch gas to improve the etch profile and selectivity when etching the sacrificial insulation layer 35 to form the open regions 39. The additive gas includes three or more gases selected from a group consisting of $O_2$, argon (Ar), octafluoropropane ($C_3F_8$), $CF_4$ and a combination thereof. The additive gas may include a combination of gases selected from a group consisting of $O_2/Ar/C_3F_8$, $O_2/Ar/CF_4$, and $O_2/Ar/C_3F_8/CF_4$.

The gas having a high carbon content is used as the main etch gas during the etching process for forming the open regions 39 because the etching process is generally required to stop at the etch stop layer 34. That is, a plasma of the gas with a high carbon content is used to stop the etching process of the sacrificial insulation layer 35 (includes an oxide-based material) at the etch stop layer 34 (includes a nitride-based material). Also, adding the additive gas to the main gas with a high carbon content allows vertically forming an etch profile of the open regions 39 and improves selectivity.

Meanwhile, the patterned silicon oxynitride layers 37A are removed while etching the sacrificial insulation layer 35 and do not remain. Thus, the patterned amorphous carbon layers 36A function as an etch barrier. Although the patterned amorphous carbon layers 36A have a high selectivity, portions of the patterned amorphous carbon layers 36A may be removed because the etching process is performed to form the open regions 39 having a large aspect ratio. The removal of the patterned amorphous carbon layers 36A may occur more heavily on the corners than on the top of the patterned amorphous carbon layers 36A. Thus, remaining amorphous carbon patterns 36B having a rounded shape are formed.

Figure 3D:
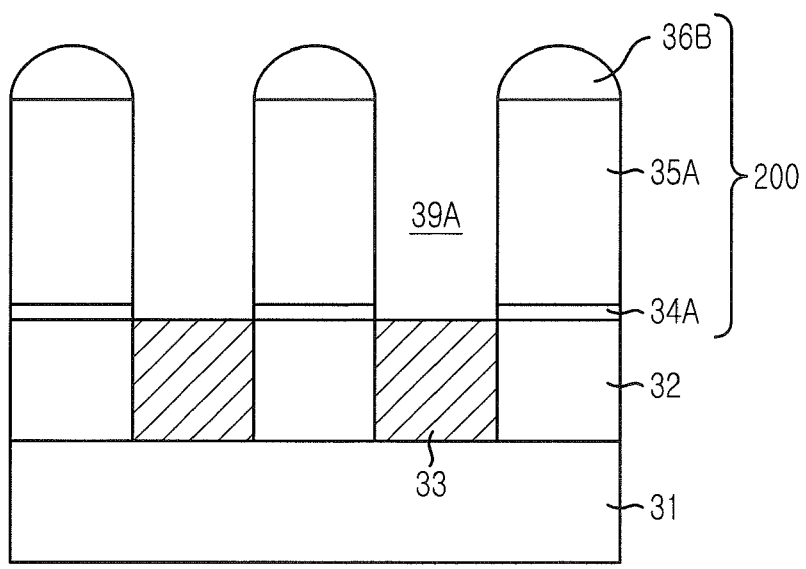

Referring to FIG. 3D, the etch stop layer 34 is selectively etched using the remaining amorphous carbon patterns 36B to form patterned etch stop layers 34A and enlarged open regions 39A. The patterned etch stop layers 34A expose top surfaces of the storage node contact plugs 33 below the enlarged open regions 39A.

The etch stop layer 34 is etched using a gas having a low carbon content. The gas having a low carbon content may include $CF_4$, fluoroform ($CHF_3$), or hexafluoroethane ($C_2F_6$). These gases have a lower carbon content than the gas having a high carbon content, such as $C_4F_6$ or $C_4F_8$, used to etch the sacrificial insulation layer 35. Thus, the etch stop layer 34 may be etched while preventing deformation of the profile of the open regions 39.

Consequently, the enlarged open regions 39A exposing the top surfaces of the storage node contact plugs 33 are formed inside the stack structure 200. The stack structure 200 includes the patterned etch stop layers 34A, the patterned sacrificial insulation layers 35A, and the remaining amorphous carbon patterns 36B formed in sequential order. That is, the enlarged open regions 39A are provided inside the stack structure 200 including insulation layers and hard mask patterns since the patterned etch stop layers 34A can be seen as insulation layers.

Figure 3E:
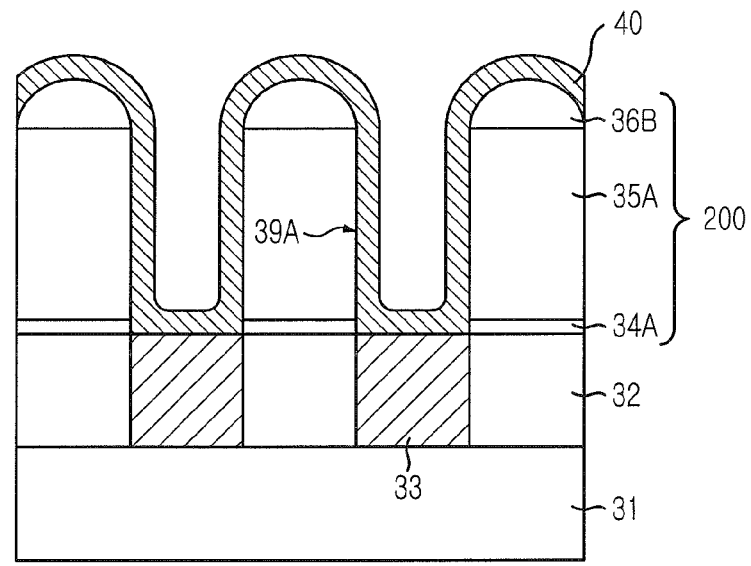

Referring to FIG. 3E, a conductive layer 40 for use as the bottom electrodes is formed over the resultant substrate structure. The conductive layer 40 includes a metal-based material. The conductive layer 40 may include one selected from a group consisting of titanium mononitride (TiN), platinum (Pt), ruthenium (Ru), and iridium (Ir). In this embodiment, the conductive layer 40 includes TiN.

Figure 3F:
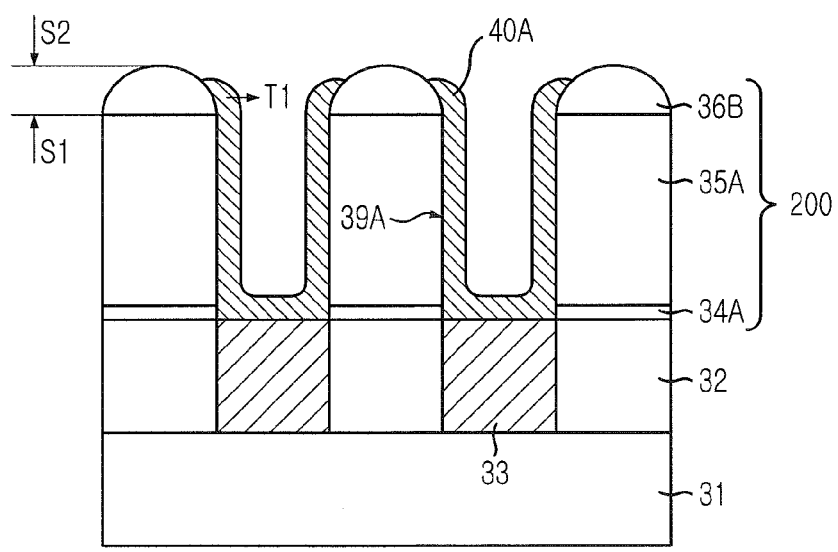

Referring to FIG. 3F, a bottom electrode isolation process is performed onto the conductive layer 40. The bottom electrode isolation process includes isolating adjacent bottom electrodes by selectively etching portions of the conductive layer 40 formed over the stack structure 200, without etching portions of the conductive layer 40 formed in the enlarged open regions 39A. Consequently, the portions of the conductive layer 40 remain only in the enlarged open regions 39A. Thus, bottom electrode layers 40A including conductive layers are formed, isolated from each other.

The bottom electrode isolation process includes using an etch-back process. The etch-back process on TiN, e.g., the conductive layer 40, uses a gas mixture including a first gas and a second gas. The first gas vertically performs a physical etching. The second gas in a plasma state reacts with TiN and performs a chemical etching. Mixing the first gas and the second gas allows an etch-back process which can selectively etch portions of TiN outside of the enlarged open regions 39A. For instance, Ar gas, which is an inert gas, is used as the first gas and a chlorine ($Cl_2$)-based gas is used as the second gas during the etch-back process of TiN. Also, an additive gas selected from a group consisting of sulfur hexafluoride ($SF_6$), trichloroborane ($BCl_3$), and $CF_4$ may be added to the gas mixture including the first gas and the second gas. Adding the additive gas may improve the characteristic of the etch-back process. The flow rate of the Ar gas ranges from approximately 60% to approximately 80% of the flow rate of the total etch gas. The flow rate of the $Cl_2$-based gas ranges from approximately 10% to approximately 30% of the flow rate of the total etch gas and the flow rate of the additive gas is approximately 10% of the flow rate of the total etch gas. The $Cl_2$-based gas may include one selected from a group consisting of $Cl_2$, hydrogen chloride (HCl), carbon tetrachloride ($CCl_4$), and a combination thereof.

An overetching may be performed with the etch-back process. The overetching is performed until the remaining amorphous carbon patterns 36B are exposed. Top portions of the bottom electrode layers 40A remain with enough height to contact the sidewalls of the remaining amorphous carbon patterns 36B. That is, the top surface of the top portions T1 of the bottom electrode layers 40A is disposed between the top surface S1 of the patterned sacrificial insulation layers 35A and the top surface S2 of the remaining amorphous carbon patterns 36B.

The bottom electrode isolation process may be performed with or without barriers such as photoresist and oxide layers. The bottom electrode isolation process performed without using barriers may be referred to as a barrierless etch-back process. Such barrierless etch-back processes can simplify the process and reduce particles generated by the barriers. Using the above-mentioned gas mixture, including the first gas and the second gas, allows an etch-back process without barriers and prevents the bottom electrodes from being damaged.

Figure 3G:
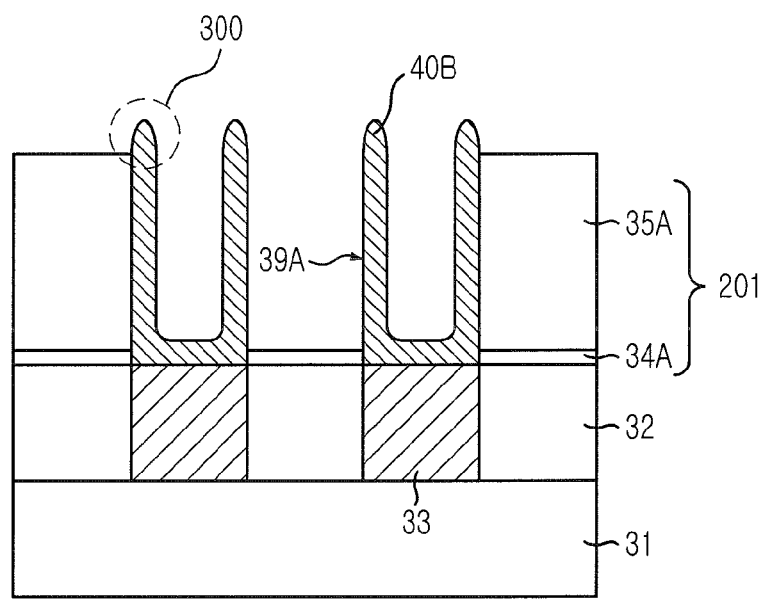

Referring to FIG. 3G, the remaining amorphous carbon patterns 36B are removed by employing a dry etch process using oxygen plasma. Similar to photoresist, amorphous carbon may be easily removed by oxygen. The bottom electrode layers 40A are transformed into bottom electrodes 40B including protruded structures 300 when the remaining amorphous carbon patterns 36B are removed. Upper portions of the bottom electrodes 40B protrude above the top surface of the patterned sacrificial insulation layers 35A and the sidewalls of the upper portions are exposed. Thus, there does not remain any material on the upper portion of the bottom electrodes 40A. Another stack structure 201 including the patterned etch stop layers 34A and the patterned sacrificial insulation layers 35A is formed.

Figure 3H:
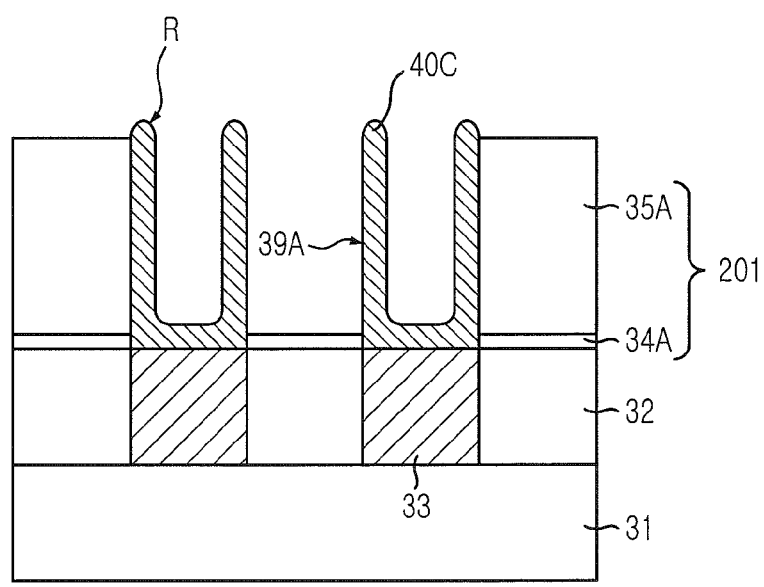

Referring to FIG. 3H, an additional etch-back process is performed. The additional etch-back process is performed to transform the protruded structures 300 of the bottom electrodes 40B into a rounded shape as denoted with reference letter R. Thus, rounded bottom electrodes 40C are formed. The upper portions of the bottom electrodes 40B having the exposed sidewalls may be evenly etched into the rounded shape because corner portions are more heavily etched than flat portions due to the characteristic of an etch-back process.

An etch target of the above-described additional etch-back process includes the patterned sacrificial insulation layers 35A of the other stack structure 201. The etching of the additional etch-back process stops at a portion disposed higher than the top surface of the patterned sacrificial insulation layers 35A. Substantially the same process conditions as those of the bottom electrode isolation process are used during the additional etch-back process because the additional etch-back process is performed onto the bottom electrodes 40B, which contains TiN. For instance, the etch-back process of TiN (e.g., the bottom electrodes 40B) uses a gas mixture including a first gas and a second gas. The first gas performs a physical etching vertically. The second gas in a plasma state reacts with TiN and performs a chemical etching. Mixing the first gas and the second gas allows an etch-back process which can selectively etch portions of TiN outside of the enlarged open regions. For instance, Ar gas, which is an inert gas, is used as the first gas and a chlorine ($Cl_2$)-based gas is used as the second gas during the etch-back process of TiN. Also, an additive gas selected from a group consisting of $SF_6$, $BCl_3$, and $CF_4$ may be added to the gas mixture including the first gas and the second gas. Adding the additive gas may improve the characteristic of the etch-back process. The flow rate of the Ar gas ranges from approximately 60% to approximately 80% of the flow rate of a total etch gas. The flow rate of the $Cl_2$-based gas ranges from approximately 10% to 30% of the flow rate of the total etch gas and a flow rate of the additive gas is approximately 10% of the flow rate of the total etch gas. The $Cl_2$-based gas may include one selected from a group consisting of $Cl_2$, HCl, $CCl_4$, and a combination thereof.

The upper portions of the bottom electrodes 40B are transformed into the rounded shape R, instead of becoming sharpened, because the additional etch-back process is performed when there is no material on the sidewalls of the upper portion of the bottom electrodes 40B. The bottom electrode isolation process and the additional etch-back process may be replaced with a chemical mechanical polishing (CMP) process. However, the CMP process generally requires a higher cost than an etch-back process. Also, the number of steps in the process may increase when using the CMP process. Thus, it is more advantageous to utilize the etch-back process.

Figure 3I:
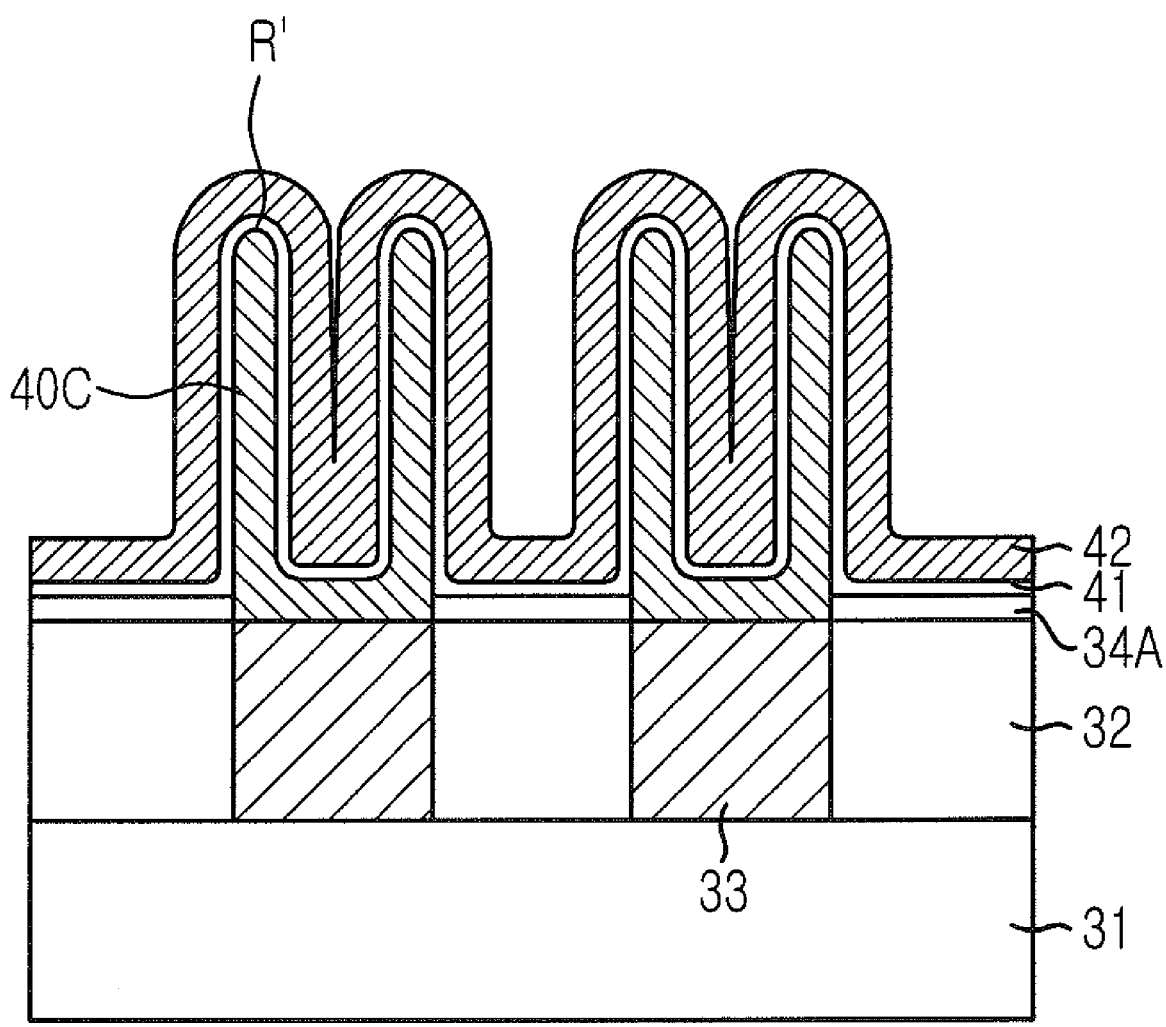

Referring to FIG. 3I, the patterned sacrificial insulation layers 35A are removed using a full dip-out process. The full dip-out process uses a hydrogen fluoride (HF) solution or a buffered oxide etchant (BOE) solution because the patterned sacrificial insulation layers 35A include an oxide-based material.

The upper portions of the rounded bottom electrodes 40C maintain the rounded shape R even after the full dip-out process is performed. A dielectric layer 41 and an upper electrode 42 are sequentially formed. The rounded shape R of the upper portions of the rounded bottom electrodes 40C is maintained even after the full dip-out process is performed because of the rounded form. Such rounded form does not function as a leakage source of the capacitor when the subsequent dielectric layer 41 and the upper electrode 42 are formed.

Consistent with this embodiment, the rounded bottom electrodes without sharp spires may be formed by: forming the open regions; forming the conductive layer for use as the bottom electrodes over the remaining amorphous carbon patterns; and sequentially performing the bottom electrode isolation process and the additional etch-back process.

For instance, upper portions of bottom electrodes may remain in a spire form on sidewalls of sacrificial insulation layers during an etch-back process when a typical bottom electrode isolation process is employed. In this embodiment, the remaining amorphous carbon patterns are removed after the bottom electrode isolation process is performed. Thus, there does not remain any material on the sidewalls of the upper portions of the bottom electrodes. That is, the spire form is not generated. The upper portions of the bottom electrodes are rounded by performing the additional etch-back process. Thus, the leakage characteristic of the capacitor does not deteriorate. Although this embodiment describes the bottom electrodes to include TiN, this embodiment may be applied to bottom electrodes including a silicon-based layer, a tungsten layer, or a precious metal-based metal layer such as Pt, Ir, and Ru.

If the bottom electrodes include a silicon-based layer, a first gas of an etch-back process may include Ar gas, which is an inert gas, and a second gas of the etch-back process may include one selected from a group consisting of a fluorine (F)-based gas, a chlorine ($Cl_2$)-based gas, a bromine (Br)-based gas, and a combination thereof. The F-based gas may include $SF_6$, $NF_3$, or $CF_4$. The $Cl_2$-based gas may include $Cl_2$. The Br-based gas may include hydrogen bromide (HBr).

If the bottom electrodes include a tungsten layer, the first gas of the etch-back process may include Ar gas, which is an inert gas, and the second gas of the etch-back process may include a fluorine-based gas. The fluorine-based gas may include one selected from a group consisting of $SF_6$, $NF_3$, $CF_4$, and a combination thereof.

If the bottom electrodes include a precious metal-based metal layer, the first gas of the etch-back process may include Ar gas, which is an inert gas, and the second gas of the etch-back process may include one selected from a group consisting of $O_2$, $Cl_2$, and a combination thereof.

Consistent with this embodiment, leakage generated by spire-shaped bottom electrodes may be reduced through rounding the upper portions of the bottom electrodes. Thus, the characteristic of the capacitor may be improved.

The present application contains subject matter related to the Korean patent application Nos. KR 2006-0018141 and KR 2006-0124737, filed in the Korean Patent Office on Feb. 24, 2006 and Dec. 8, 2006, respectively, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a capacitor in a semiconductor device, the method comprising:
    forming a stack structure providing a plurality of open regions, the stack structure including an insulation layer, an etch stop layer and a hard mask pattern comprising amorphous carbon;
    forming a conductive layer over the stack structure and in the open regions;
    etching a portion of the conductive layer formed outside the open regions to form bottom electrodes in the open regions;
    removing the hard mask pattern; and
    etching upper portions of the bottom electrodes that are exposed after the hard mask pattern is removed.

2. The method of claim 1, wherein the etching-a-portion-of-the-conductive-layer step and the etching-the-upper-portions-of-the-bottom-electrodes step comprise performing an etch-back process.

3. The method of claim 2, wherein performing the etch-back process associated with the etching-a-portion-of-the-conductive-layer step comprises controlling an etch target in a manner that a top surface of the bottom electrodes is formed at a higher position than a top surface of the insulation layer.

4. The method of claim 3, wherein performing the etch-back process associated with the etching-a-portion-of-the-conductive-layer step comprises performing an overetch, and an etch target of the overetch comprises exposing the hard mask pattern.

5. The method of claim 2, wherein performing the etch-back process associated with the etching-the-upper-portions-of-the-bottom-electrodes step comprises having the insulation layer as an etch target.

6. The method of claim 1, wherein the hard mask pattern comprises a stacked layer configured with an amorphous carbon layer and a silicon oxynitride layer, and the amorphous carbon layer remains after the open regions are formed.

7. The method of claim 6, wherein the amorphous carbon layer has a thickness ranging from approximately 3,000 Å to approximately 10,000 Å, and the silicon oxynitride layer has a thickness ranging from approximately 300 Å to approximately 1,000 Å.

8. The method of claim 6, wherein selectively removing the hard mask pattern comprises performing a dry etching process using oxygen plasma.

9. The method of claim 1, wherein the insulation layer of the stack structure comprises an etch stop layer and a sacrificial insulation layer, the etch stop layer comprising a nitride-based layer and the sacrificial insulation layer comprising an oxide-based layer.

10. The method of claim 9, wherein forming the stack structure comprises:
    forming the etch stop layer, the sacrificial insulation layer, and a hard mask;
    forming a photoresist pattern over the hard mask;
    etching the hard mask using the photoresist pattern as an etch barrier to form the hard mask pattern;
    etching the sacrificial insulation layer using the hard mask pattern as an etch barrier to form the open regions; and
    etching the etch stop layer provided below the open regions.

11. The method of claim 10, wherein the sacrificial insulation layer is etched using a gas having a high carbon content, and the etch stop layer is etched using a gas having a low carbon content.

12. The method of claim 11, wherein the gas having a high carbon content comprises one selected from a group consisting of $C_4F_6$ and $C_4F_8$, and the gas having a low carbon content comprises one selected from a group consisting of tetrafluoromethane ($CF_4$), fluoroform ($CHF_3$), and hexafluoroethane ($C_2F_6$).

13. The method of claim 12, wherein etching the sacrificial insulation layer comprises using a gas mixture including the gas having a high carbon content and three or more gases selected from a group consisting of oxygen ($O_2$), argon (Ar), octafluoropropane ($C_3F_8$), $CF_4$, and a combination thereof.

14. The method of claim 1, wherein the etching-a-portion-of-the-conductive-layer step uses a gas mixture including a first gas for performing a physical etching and a second gas for performing a chemical etching by reacting a plasma of the second gas with the conductive layer.

15. The method of claim 14, wherein the conductive layer comprises titanium mononitride (TiN), the first gas comprises an inert gas, and the second gas comprises a chlorine-based gas.

16. The method of claim 15, wherein the inert gas comprises Ar gas and the chlorine-based gas comprises one selected from a group consisting of chlorine ($Cl_2$), hydrogen chloride (HCl), carbon tetrachloride ($CCl_4$), and a combination thereof.

17. The method of claim 16, wherein an additive gas selected from a group consisting of sulfur hexafluoride ($SF_6$), trichloroborane ($BCl_3$), and $CF_4$ is added to the gas mixture comprising the inert gas and the chlorine-based gas.

18. The method of claim 17, wherein a flow rate of the inert gas ranges from approximately 60% to approximately 80% of a flow rate of a total etch gas, a flow rate of the chlorine-based gas ranges from approximately 10% to approximately 30% of the flow rate of the total etch gas, and a flow rate of the additive gas is approximately 10% of the flow rate of the total etch gas.

19. The method of claim 1, further comprising, after selectively etching the upper portions of the bottom electrodes:
    removing the insulation layer using a full dip-out process; and
    sequentially forming a dielectric layer and an upper electrode over the bottom electrodes.

* * * * *